(12) United States Patent  
Kristiansen (10) Patent No.: US 9,577,601 B2  
(45) Date of Patent: Feb. 21, 2017

(54) BROADCAST SERIAL BUS TERMINATION

(75) Inventor: Karstein Kristiansen, Trondheim (NO)

(73) Assignee: Siemens Aktiengesellschaft, München (DE)

( * ) Notice: Subject to any disclaimer, the term of this patent is extended or adjusted under 35 U.S.C. 154(b) by 640 days.

(21) Appl. No.: 14/130,277

(22) PCT Filed: Jun. 20, 2012

(86) PCT No.: PCT/EP2012/061868  
§ 371 (c)(1),  
(2), (4) Date: Dec. 30, 2013

(87) PCT Pub. No.: WO2013/004504  
PCT Pub. Date: Jan. 10, 2013

(65) Prior Publication Data  
US 2014/0156899 A1  Jun. 5, 2014

(30) Foreign Application Priority Data

Jul. 1, 2011 (EP) ..................... 11172397

(51) Int. Cl.  
*G06F 13/14* (2006.01)  
*H03H 7/38* (2006.01)  
*G06F 13/40* (2006.01)  
*G06F 13/42* (2006.01)

(52) U.S. Cl.  
CPC ............ *H03H 7/38* (2013.01); *G06F 13/4081* (2013.01); *G06F 13/4282* (2013.01)

(58) Field of Classification Search  
None  
See application file for complete search history.

(56) References Cited

U.S. PATENT DOCUMENTS

| 7,541,830 B2 | 6/2009 | Fahrbach et al. |
| 2005/0226080 A1* | 10/2005 | Lee ............ G11C 5/04 365/230.03 |
| 2006/0132170 A1 | 6/2006 | Fahrbach et al. |

(Continued)

FOREIGN PATENT DOCUMENTS

| CN | 100559782 C | 11/2009 |
| CN | 101727431 A | 6/2010 |

(Continued)

OTHER PUBLICATIONS

Chinese Office action for related Chinese Application No. 201280032923.4, dated Jul. 20, 2015, with English Translation.

(Continued)

*Primary Examiner* — Henry Tsai  
*Assistant Examiner* — Dean Phan  
(74) *Attorney, Agent, or Firm* — Lempia Summerfield Katz LLC (57) ABSTRACT

A subsea broadcast serial bus system includes a broadcast serial bus having a first signal line and a second signal line. One or more nodes are connected in parallel to the first signal line and the second signal line of the broadcast serial bus. Each node connects the first signal line to the second signal line via a node impedance. A subsea node connected to the broadcast serial bus includes an adjustable impedance that may be adjusted based on the number of nodes connected to the broadcast serial bus.

20 Claims, 5 Drawing Sheets

(56) References Cited

U.S. PATENT DOCUMENTS

2010/0194428 A1* 8/2010 Koo .............. H03K 19/018521
326/30

FOREIGN PATENT DOCUMENTS

| DE | 19854117 A1 | 5/2000 |
|----|-------------|--------|
| DE | 10261386 A1 | 7/2004 |
| WO | 9819430 | 5/1998 |

OTHER PUBLICATIONS

European Search Report in corresponding European Patent Application No. EP 11 172 397.9, dated Oct. 11, 2011.
International Search Report and Written Opinion in corresponding PCT Application No. PCT/EP2012/061868, dated Aug. 16, 2012.

* cited by examiner

BROADCAST SERIAL BUS TERMINATION

RELATED APPLICATIONS

This application is the National Stage of International Application No. PCT/EP2012/061868, filed Jun. 20, 2012, which claims the benefit of European Patent Application No. EP 11172397, filed Jul. 1, 2011. The entire contents of both documents are hereby incorporated herein by reference

TECHNICAL FIELD

The present teachings relate generally to broadcast serial bus termination circuits, subsea nodes that include a broadcast serial bus termination circuit, subsea broadcast serial bus systems, and methods of terminating a broadcast serial bus.

BACKGROUND

Bus systems may be used to facilitate communication between devices. A controller area network (CAN) bus is one type of a bus system that may be used in automotive applications and in industry automation. Several nodes that are capable of sending and receiving messages (e.g., controllers, sensors, and actuators) are connected to the bus. For example, a node connected to the CAN bus may include a processing unit configured for processing sensor data, a CAN-controller for compiling messages to be transmitted on the bus or decoding received messages, and a transceiver for generating the electric signals that transmit the message on the CAN bus.

Figure 1:
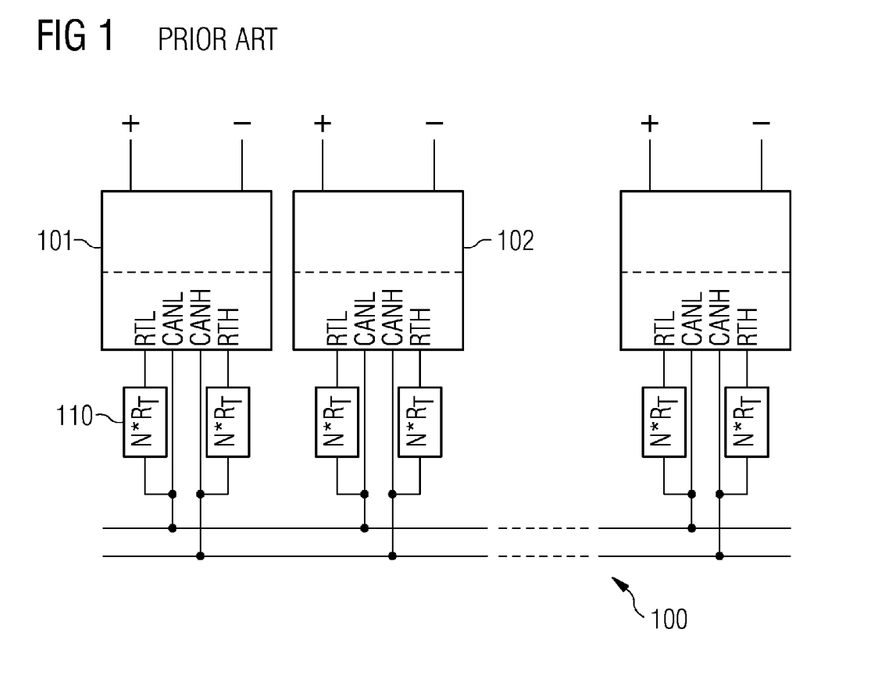
FIG. 1 illustrates a conventional CAN bus.

FIG. 1 illustrates a CAN bus 100. A number N of nodes 101, 102, and so forth are coupled to the CAN bus 100. Each CAN node is locally powered. The CAN bus 100 may be operated with a predetermined termination impedance ($R_T$). To achieve the predetermined termination impedance on the bus, each node 101, 102, and so forth includes a termination impedance 110 having a resistance value of $N*R_T$. If N nodes are connected to the bus, the total bus impedance will be $R_T$.

A problem arises if nodes are to be added to or removed from the bus. The bus impedance may change and an impedance mismatch on the CAN bus may result.

This problem may occur in a subsea environment where the bus and the nodes connected to the bus are inaccessible. If a node is disconnected from the bus (e.g., due to failure of the node), the bus impedance will change. The change in bus impedance may be detrimental to reliable operation of the remaining nodes. As a result, communication between the different nodes may be disturbed and the whole system may need costly and time-intensive servicing.

SUMMARY AND DESCRIPTION

The scope of the present invention is defined solely by the appended claims, and is not affected to any degree by the statements within this summary.

There is a need to obviate at least some of the drawbacks described above and to improve the flexibility of a multidrop serial bus with respect to the number of connected nodes.

The present embodiments may obviate one or more of the above-described drawbacks or limitations in the related art. For example, in some embodiments, nodes may be connected to and disconnected from the bus without compromising the functionality of the bus. In some embodiments impedance mismatches that may result in signal reflections and degrade system operability are avoided.

In some embodiments, a broadcast serial bus termination circuit for a broadcast serial bus is provided. The broadcast serial bus termination circuit is configured to have a variable number of nodes connected thereto. The nodes may be connected in parallel to a first signal line and a second signal line of the broadcast serial bus. Each node may connect the first signal line to the second signal line via a node impedance. The broadcast serial bus may be operated with a predetermined bus impedance. The broadcast serial bus termination circuit includes an adjustable impedance that, in operation, is connected between the first signal line and the second signal line of the broadcast serial bus. The broadcast serial bus termination circuit further includes an adjusting unit configured for adjusting the adjustable impedance. The adjusting unit is configured for adjusting the adjustable impedance based on the number of nodes connected to the broadcast serial bus. The broadcast serial bus termination circuit is further configured for adjusting the adjustable impedance, such that the total impedance of the broadcast serial bus corresponds to the predetermined bus impedance for different numbers of nodes connected to the broadcast serial bus.

If nodes are disconnected from or connected to the broadcast serial bus, the termination circuit may keep the total impedance of the broadcast serial bus substantially constant. If the node impedances are connected in parallel across the first signal line and the second signal line of the broadcast serial bus, the removal of a node will increase the total bus impedance.

The adjusting unit may be configured to decrease the value of the adjustable impedance, such that the total impedance of the broadcast serial bus also decreases and the predetermined bus impedance is reached. The termination circuit may make the connecting and disconnecting of units from the broadcast serial bus more flexible. This flexibility may be advantageous in subsea environments where nodes of the broadcasts serial bus are not easily accessible. The adjustable impedance may be adjusted by setting a resistance value of the adjustable impedance. The resistance value may be controlled by the adjusting unit.

In some embodiments, the adjustable impedance may be adjustable to integer fractions of the node impedance. The node impedance of each node may, for example, be $N \times R_T$, where N is the maximum number of connectable nodes and $R_T$ is the predetermined bus impedance. Thus, the adjustable impedance may be adjustable to resistance values of an integer fraction of $N \times R_T$. The fraction may, for example, be the number of disconnected nodes+1 (e.g., if no node is disconnected, the adjustable impedance is $N \times R_T$). The termination circuit may be configured for adjusting the actual bus impedance to the predetermined bus impedance for any number of connected nodes up to the maximum node number N. The termination circuit may be part of a node having the adjustable impedance as a node impedance.

In some embodiments, the adjustable impedance includes a voltage controlled resistance. The resistance value of the adjustable impedance may be controlled by applying a corresponding control voltage. An automatic adjustment of the adjustable impedance may be feasible. In some embodiments, the control voltage may be manually adjusted or preset (e.g., by a software user interface).

The adjustable impedance may include a field effect transistor. In some embodiments, the field effect transistor may include a junction gate field effect transistor (JFET). The field effect transistor may be operated as a voltage controlled resistance. The adjustable impedance may thus be simply adjusted to different resistance values. In some embodiments, the adjustable impedance may include a resistor ladder. As described above, the resistances in the resistance ladder may have steps that correspond to an integer fraction of the node impedance, such that the adjustable impedance may be adjustable in the corresponding steps. The resistance ladder network may have switches configured for manual or electronic switching. In some embodiments, the adjusting unit may include a controller that is configured for controlling the value of the adjustable impedance (e.g., resistance value). In some embodiments, the controller may provide a control voltage to a voltage controlled resistance. In some embodiments, the controller may switch the electronic switches of a resistor ladder. In some embodiments, automatic control of the adjustable impedance or remote manual control (e.g., via a software interface from a topside control center) are provided.

In some embodiments, the controller may include a micro controller. The controller may be part of a node that includes the broadcast serial bus termination circuit.

In some embodiments, the adjusting unit may include mechanical switches configured such that different values of the adjustable impedance may be selected based on actuation of the mechanical switches. For example, the adjusting unit may include dip switches configured for stepwise reduction of the adjustable impedance starting at a maximum value. The total bus impedance may be configured for a number of connected nodes by the mechanical switches. For example, the mechanical switches may be used for switching the resistances of a resistor ladder. The mechanical switches may also be electronically controlled by a controller (e.g., mechanical relays). In such a configuration, galvanic isolation may be achieved, and different resistance values of the adjustable impedance may be selected.

In some embodiments, the broadcast serial bus termination circuit is configured for adjusting the total impedance of the broadcast serial bus to match the predetermined bus impedance for any number of nodes connected to the broadcast serial bus up to a predetermined maximum number (N) of nodes. The broadcast serial bus termination circuit may be configured for a maximum node number. The maximum mode number may be sufficiently high to provide a flexible broadcast serial bus configuration.

In some embodiments, a subsea node for a broadcast serial bus is provided. The broadcast serial bus has a variable number of nodes connected thereto. The nodes may be connected in parallel to a first signal line and a second signal line of the broadcast serial bus. Each node connects the first signal line to the second signal line via a node impedance. The broadcast serial bus may be operated with a predetermined bus impedance. The subsea node includes a broadcast serial bus termination circuit having a configuration of a type described above. The broadcast serial bus termination circuit is, in operation, connected to the first signal line and the second signal line.

The subsea node may provide a flexible and adjustable termination of the broadcast serial bus. In some embodiments, the subsea node may be a terminating node that terminates the broadcast serial bus and may achieve similar advantages as the advantages outlined above.

In some embodiments, the subsea node is configured for automatically determining the number of additional nodes connected to the broadcast serial bus. The subsea node may be further configured to adjust the adjustable impedance by the adjusting unit based on the determined number of connected nodes. Thus, an automatic compensation of the total bus impedance for missing or disconnected nodes may be achieved. In some embodiments, the subsea node may be a master node located in a subsea canister. The remaining nodes may be sensor nodes external to the subsea canister. In case of failure of one of the external nodes, the node may be disconnected and compensated for by the subsea node. The external nodes may also be provided in a subsea canister (e.g., of the equipment that uses the external nodes) or in a separate canister.

In some embodiments, the subsea node and the additional nodes connected to the broadcast serial bus are powered from the same power bus. The subsea node is configured for measuring the power consumption on the power bus in order to determine the number of additional nodes connected to the broadcast serial bus. For example, if the nodes are disconnected, the power consumption will be reduced. The subsea node may use the reduction in power consumption to determine the reduced number of nodes connected to the broadcast serial bus. For example, the nodes connected to the broadcast serial bus may be of the same type (e.g., sensor nodes) and may thus consume the same amount of electric power. The current on the power bus may be measured by the subsea node to determine the power consumption and, therefore, the number of connected nodes. If the number of connected nodes is determined, the subsea node may automatically set the adjustable impedance to a resistance value, such that the total bus impedance of the broadcast serial bus matches the predetermined bus impedance.

In some embodiments, a subsea broadcast serial bus system is provided. The subsea broadcast serial bus system includes a broadcast serial bus having a first signal line and a second signal line, one or more nodes connected in parallel to the first signal line and the second signal line, and a subsea node in any of the configurations described above. Each node connects the first signal line to the second signal line via a node impedance. The subsea node is connected to the first signal line and the second signal line and terminates the broadcast serial bus.

In some embodiments, the subsea broadcast serial bus system is flexible with respect to the connection and disconnection of nodes, and may achieve one or more of the advantages described herein.

In some embodiments, the subsea broadcast serial bus system further includes a subsea canister. The subsea node may be a master node located inside the subsea canister. The additional nodes connected to the broadcast serial bus may be sensor nodes located outside the subsea canister. In such configurations, additional nodes may be connected to or removed from the broadcast serial bus (e.g., when installing or removing new equipment in a subsea installation). The subsea canister including the master node may not be removed for adjusting the broadcast serial bus termination, and the adjustable impedance may be remotely or automatically set.

In some embodiments, the subsea broadcast serial bus system further includes a power bus. The subsea node and the additional nodes connected to the broadcast serial bus are supplied with electric power by the power bus. In addition to having a common electric reference, the subsea node may automatically determine the number of nodes connected to the power bus (e.g., by measuring a current on the power bus as described above). For systems that include a subsea canister where the subsea node is located, the power bus may be supplied with electric power inside the subsea canister. For example, the power bus may be coupled inside the canister to a power supply network, a transformer, or the like.

In some embodiments, the broadcast serial bus may be a serial based multidrop bus. In some embodiments, the broadcast serial bus may be a controller area network (CAN) bus or a Profibus.

In some embodiments, a method for terminating a broadcast serial bus is provided. The method includes determining a number of nodes connected to the broadcast serial bus, and adjusting an impedance of a node connected between a first signal line and a second signal line of the broadcast serial bus based on the determined number of connected nodes. The adjusting of the impedance is performed such that the total impedance on the broadcast serial bus corresponds to a predetermined bus impedance for operation of the broadcast serial bus.

One or more advantages similar to the ones described above may be achieved with methods in accordance with the present teachings.

In some embodiments, the method may further include any of the features described herein. The impedance may be adjusted automatically or by user input. Adjustments to the impedance may be performed by an adjusting unit. The adjusting unit may be implemented as described above. The method may be performed using a broadcast serial bus termination circuit, a subsea node, or a subsea broadcast serial bus system.

It is to be understood that elements and features of the various representative embodiments described below may be combined in different ways to produce new embodiments that likewise fall within the scope of the present teachings.

BRIEF DESCRIPTION OF THE DRAWINGS

In the drawings, like reference characters are used to designate like elements.

DETAILED DESCRIPTION

Exemplary embodiments will be described in reference to the accompanying drawings. It is to be understood that the following description of the exemplary embodiments is given only for the purpose of illustration and is not to be taken in a limiting sense.

The drawings are schematic representations and elements in the drawings may not be drawn to scale. Rather, the representation of the various elements is provided such that the function and general purpose of the elements becomes apparent. The physical or functional units illustrated and described herein with respect to the different exemplary embodiments may not be implemented as physically separate units. One or more physical or functional blocks or units may be implemented in a common circuit, chip, circuit element, or unit, whereas other physical or functional blocks or units may be implemented in separate circuits, chips, circuit elements, or units.

Although the following description may refer to a controller area network (CAN) bus and sensor nodes connected thereto, the present teachings are also applicable to other types of broadcast serial busses and other types of nodes connected thereto.

Figure 2:
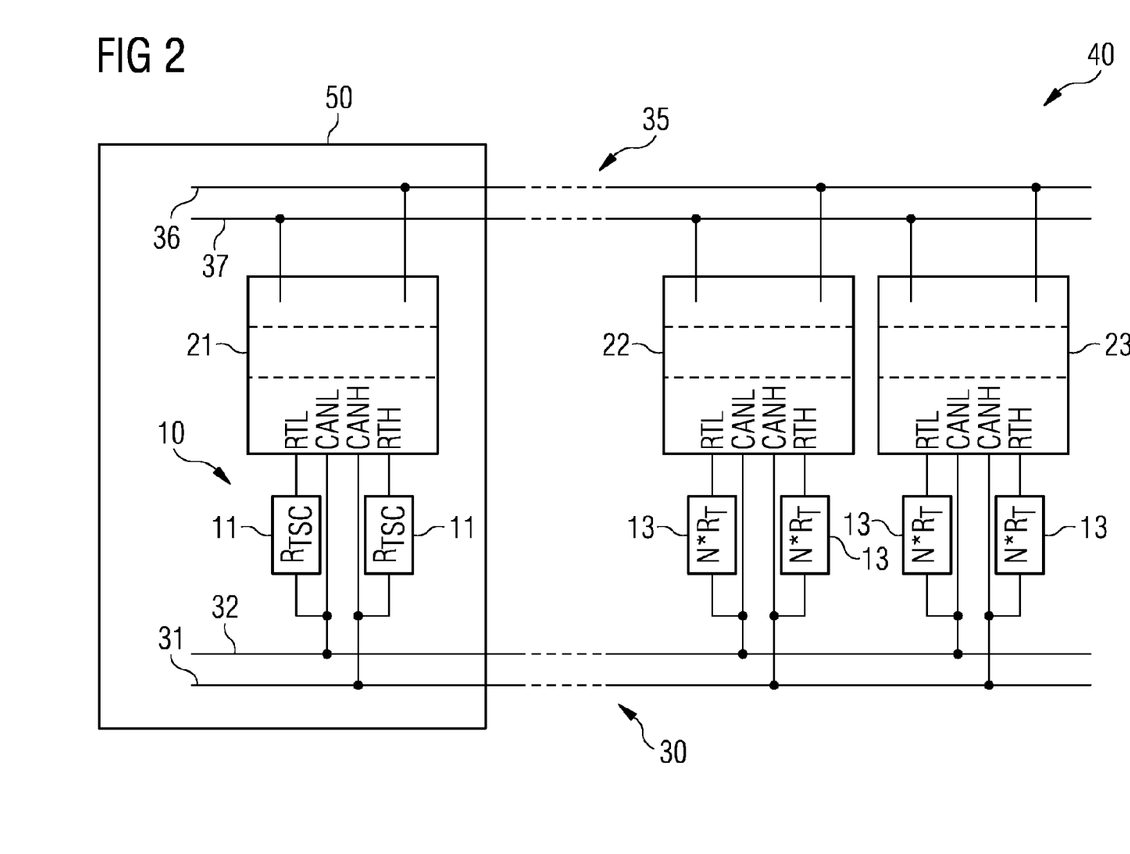
FIG. 2 is a schematic diagram illustrating an exemplary subsea broadcast serial bus system including an exemplary subsea node.

FIG. 2 schematically illustrates a broadcast serial bus termination circuit 10 that is coupled to a broadcast serial bus 30 (e.g., a CAN bus). The broadcast serial bus 30 has a first signal line 31 (CANH) and a second signal line 32 (CANL). The broadcast serial bus termination circuit 10 includes an adjustable impedance 11 that, in operation, is connected between a first signal line 31 and a second signal line 32 of the broadcast serial bus 30. The broadcast serial bus termination circuit further includes an adjusting unit (not shown in FIG. 2) that will be described below in reference to FIGS. 3 and 4.

FIG. 2 further shows a subsea node 21 that includes the broadcast serial bus termination circuit 10. The subsea node 21 may be a master node (e.g., a node having a high priority and, in some embodiments, the highest priority of the nodes connected to bus 30). The subsea node 21 is coupled to a first line 36 and a second line 37 of the power bus 35. The subsea node 21 obtains the supply voltage for operation from the power bus 35.

FIG. 2 further shows a subsea broadcast serial bus system 40 that includes the subsea node 21, the broadcast serial bus 30, the power bus 35, and additional nodes 22, 23, and the like connected to the two broadcast serial bus 30 and the power bus 35. The system 40 may be part of a subsea based sensor network. The subsea node 21 may be a master node located in a subsea canister 50. The remaining nodes 22, 23, and so forth are external nodes (e.g., subsea sensor nodes). The power to each sensor node 22, 23, and so forth is supplied from the subsea canister 50 on the power bus 35. The nodes are connected in parallel to the broadcast serial bus 30. Each node connects the first signal line 31 and the second signal line 32. The removal of a node from bus 30 does not interrupt the connection between the remaining connected nodes.

The subsea node 21 and the additional nodes 22 and 23 coupled to the broadcast serial bus 30 may have a configuration based on three levels. On an application level, a microcontroller may communicate with a sensor or other equipment (e.g., a controller, an actuator, or the like). The microcontroller may transmit commands or data to the equipment, or may receive data or commands that are to be transported on the broadcast serial bus from the equipment. The microprocessor may hand down the user data that is to be sent to a next level that includes a bus controller (e.g., a CAN controller). For example, the bus controller may compile a frame or a message in accordance with the protocol used for data transmission on the broadcast serial bus 30. The bus controller may further provide a check sum and may initiate the sending of the frame/message. The bus controller may further decode received messages and provide the user data extracted from the received message to the microcontroller.

On the lowest level, a transceiver may perform the actual physical generation of signals to be transmitted on the first signal line 31 and the second signal line 32 of the broadcast serial bus 30.

The transceiver may include a driver that generates the CAN_H and CAN_L signals on the signal lines of the bus 30. The transceiver may further include a receiver (e.g., in form of a comparator) that reads voltage signals of the signal lines.

To achieve high noise immunity, the broadcast serial bus 30 is maintained at a low differential bus impedance. The low differential bus impedance may be achieved by using a low value terminating resistance that may have a value in a range of about 50 to about 1000 Ohms (e.g., 100 or 120 Ohms). A dominant state may be set on the bus by the transceiver applying +5 volt to CAN_H and zero volt to CAN_L. A recessive state may be present on the bus if none of the transceivers of the nodes connected to the bus is asserting a dominant state. Both signal lines may then be at a potential of about 2.5 V (e.g., 2.6 V and 2.4 V for the CANH and CANL signal lines, respectively).

The above values provided in the description of the operation of the bus system are purely representative and are not to be taken in a limiting or absolute sense.

Each node has a node impedance 13. The node impedance 30 may be in the form of a termination resistance connected across the first signal line 31 and the second signal line 32 when the node is connected thereto. To achieve a total bus impedance of $R_T$, the value of the termination resistance 13 in each node connected to the bus 30 may be set to $N \times R_T$, where N is the total number of nodes connected to the bus (including the master node 21 located in the subsea canister). N−1 external sensor nodes 22, 23, etc. may then be connected to the bus 30. If fewer than N−1 external nodes are connected, the total bus impedance is raised. The raising of the total bus impedance may result in a degraded operation of broadcast serial bus 30 (e.g., a loss in signal quality, increased signal reflections, and the like).

To provide a more flexible connection of nodes to the broadcast serial bus 30 without degrading the quality of signal transmission on the bus (e.g., to enable the connection of a variable number of external nodes to the bus 30), the subsea node 21 may include the termination circuit 10 where an adjustable impedance 11 ($R_{TSC}$) is used. The adjustable impedance 11 may be implemented by a termination resistor having an adjustable resistance value. The adjustable impedance may be adjusted based on the number of connected external nodes 22, 23, and so forth. In order to adjust the total impedance of the broadcast serial bus 30 to the desired bus impedance, the resistance value of the adjustable impedance 11 may be determined as described below.

The total impedance $R_T$ on the broadcast serial bus 30 may be calculated as:

$$R_T = \frac{\left(\frac{N * R_T}{n}\right) * R_{TSC}}{\left(\frac{N * R_T}{n}\right) + R_{TSC}} \quad (1)$$

where N is the maximum total number of nodes connected to broadcast serial bus 30 (including subsea node 21), n is the number of currently connected external nodes, and $R_{TSC}$ is the resistance value of the adjustable impedance of subsea node 21 in subsea canister 50. As described above, $R_{TSC}$ may be set so that the desired bus impedance $R_T$ is reached (e.g., $R_T$=100 Ohm or 120 Ohm).

Solving the equation (1), $R_{TSC}$ may be determined for any number of connected external (e.g., sensor) nodes between 1 and N−1, as shown in equation (2).

$$R_{TSC} = \frac{N * R_T}{N - n} \quad (2)$$

To reach the desired total bus impedance $R_T$, the adjustable impedance may be implemented with selectable resistance values $R_{TSC}$ for n=1 to n=N−1. The selection of the resistance value $R_{TSC}$ may be done based on the currently connected number of nodes n. The total impedance of broadcast serial bus 30 may be adjusted to the desired value of $R_T$.

By way of example, if the maximum number of nodes (N) is connected to broadcast serial bus 30, the adjustable impedance 11 will have a resistance value of $R_{TSC}$=N*$R_T$ that is similar to all remaining nodes connected to bus 30. If nodes are removed from the bus, the number n of external nodes connected to the bus decreases. According to equation 2, if one, two, or three nodes are removed from the broadcast serial bus 30, the resistance $R_{TSC}$ may be determined as N*$R_T$/2, N*$R_T$/3, and N*$R_T$/4, respectively. Thus, the resistance value is an integer fraction of the node impedance N*$R_T$, where the denominator corresponds to the number of removed external nodes+1.

When configuring the subsea broadcast serial bus system 40, N may be set to a number higher than the number of external nodes that are actually installed, such that additional external nodes may be installed.

By using a broadcast serial bus termination circuit that includes the adjustable impedance 11, the total impedance on broadcast serial bus 30 may be maintained constant even when external nodes 22, 23, etc. are disconnected from the bus 30 or when additional nodes are connected to the bus 30.

The subsea node 21 and the subsea broadcast serial bus system 40 shown in FIG. 2 may include additional components or may be provided in different configurations. For example, the subsea node 21 may be provided with a body incorporating the adjustable resistances 11, and may be provided with connectors for connecting to the broadcast serial bus 30. Additional impedances (e.g., resistors) may be provided. The additional impedances may be switched parallel or in series with adjustable impedance 11.

Each node includes two termination impedances. For example, in operation, one impedance may be connected between the high signal line (CAN_H) and the ground rail (0V), and the other impedance may be connected between the low signal line (CAN_L) and the high voltage rail (e.g. +5V). This configuration of the nodes 21, 22, 23, etc. is merely representative, and other configurations may be used. Although illustrated as separate units, the adjustable impedance 11 is part of the subsea node 21, and the node impedances 13 are part of the respective node 22, 23, etc. The detailed and general description provided above is also applicable to the further examples described below.

Figure 3:
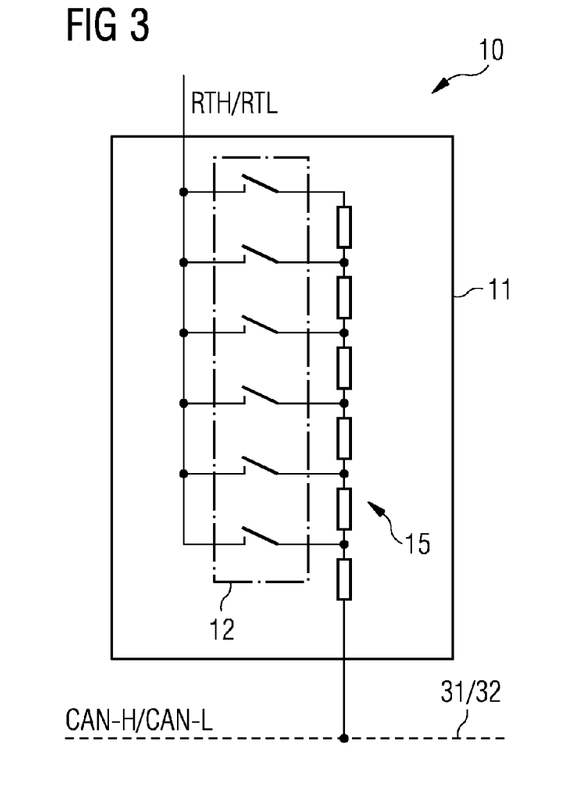
FIG. 3 is a schematic diagram illustrating an exemplary first implementation of an adjustable impedance.
Figure 4:
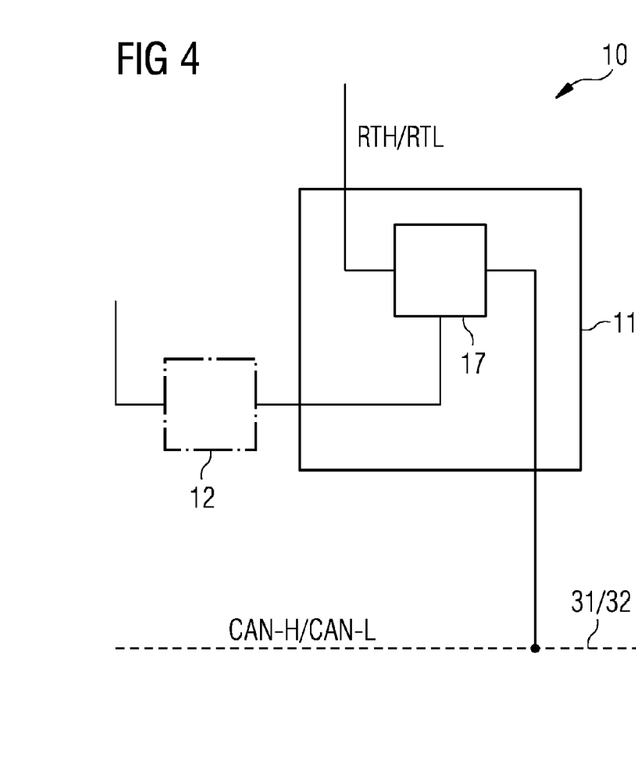
FIG. 4 is a schematic diagram illustrating an exemplary second implementation of an adjustable impedance.

FIGS. 3 and 4 show different configurations of the broadcast serial bus termination circuit 10 that may be implemented in the subsea node 21 of FIG. 2. In FIG. 3, the adjustable impedance 11 of the broadcast serial bus termination circuit 10 includes a resistor ladder 15. The adjustable impedance 11 may be the terminating resistor for the high (H) or the low (L) signal line. As shown in FIGS. 3 and 4, the adjustable impedance 11 may be connected to either CAN_H or CAN_L. The adjustable impedance 11 includes an adjusting unit 12 that may be implemented as a number of switches. The resistance value of the adjustable impedance 11 may be selected using the switches.

The switches of the adjusting unit 12 may be mechanical switches or electronic switches. The resistors in the resistor ladder 15 may be configured such that the total resistance of the adjustable impedance 11 may be set (e.g., to integer fractions of N*$R_T$) by closing the switches of the adjusting unit 12. The resistors of the resistor ladder 15 may be configured to give a maximum resistance of $NR_T$ that may be set by closing the top switch.

The switches of the adjusting unit 12 may be mechanical switchers (e.g., dip switches). In other embodiments, the switches may be electronic switches. A microcontroller configured for controlling the electronic switches may be provided in the subsea node. The microcontroller may receive a command (e.g., over a communication connection) to set the appropriate resistance. Alternatively, the resistance may be set by software running on the microcontroller. Thus, the resistance value of the adjustable impedance 11 may be set by controlling the software or by sending a command from the remote location.

In the example of FIG. 4, the adjustable impedance 11 includes a voltage controlled resistance 17 that may be implemented as a field effect transistor (FET). In some embodiments, the FET is a junction gate field effect transistor (JFET). By providing a corresponding control voltage at the gate of the voltage controlled resistance 17, the resistance value of the adjustable impedance 11 may be set. An adjusting unit 12 may be provided. The adjusting unit 12 may include a controller (e.g., a microprocessor, a digital signal processor, or the like). The adjusting unit 12 provides the control voltage to the voltage controlled resistance 17, thereby adjusting the resistance value of the adjustable impedance 11 as described above (e.g., in integer fractions of the node impedance $NR_T$). The controller or adjusting unit 12 may use a preconfigured software to select the appropriate control voltage. Alternatively, the controller or adjusting unit 12 may receive a command from a remote location (e.g., input by a user) to adjust the control voltage.

Figure 5:
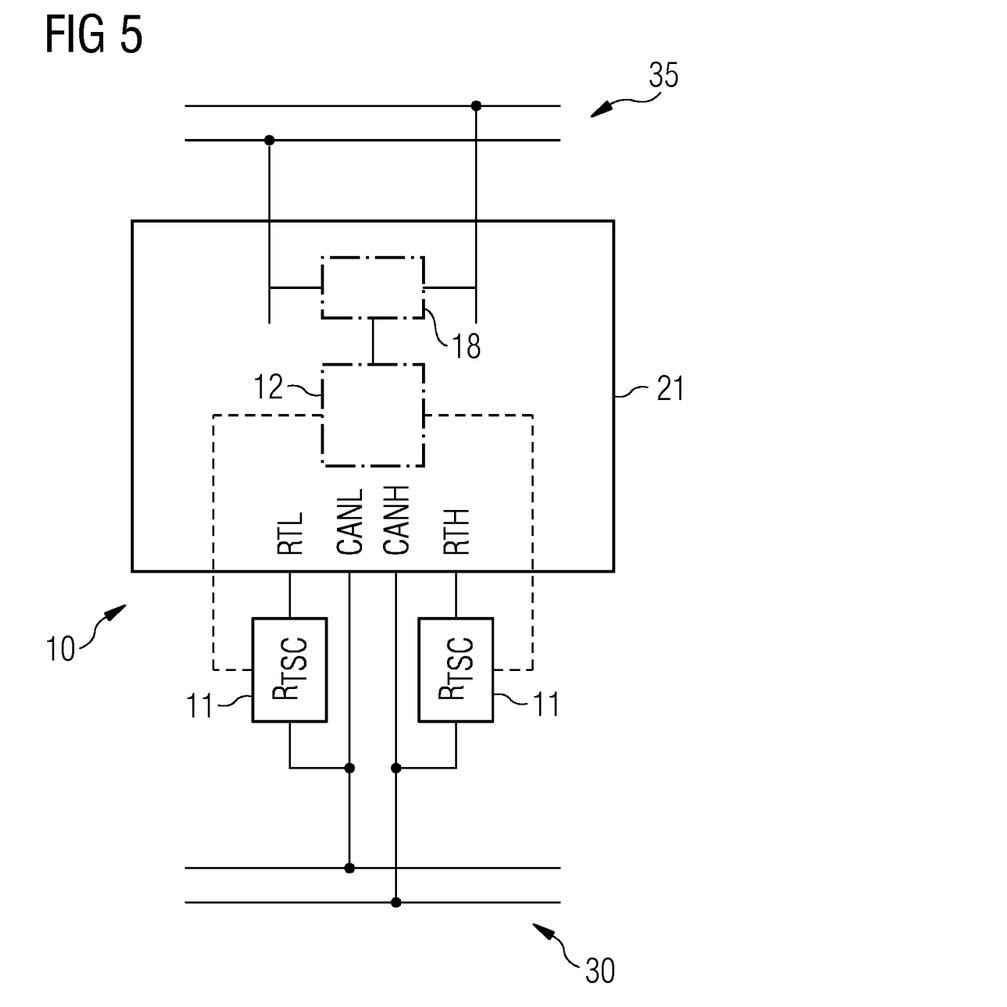
FIG. 5 is a schematic diagram illustrating an exemplary subsea node.

In some embodiments, the adjusting unit 12 may adjust the resistance value automatically, as described below in reference to FIG. 5. FIG. 5 shows an exemplary implementation of subsea node 21. The subsea node 21 may include a broadcast serial bus termination circuit 10 having a configuration as shown in FIG. 2, 3, or 4. The subsea node 21 is connected to the power bus 35 and the broadcast serial bus 30. The termination circuit 10 includes the adjustable impedances 11 and the adjusting unit 12. The adjusting unit 12 is implemented as a controller configured to automatically set the resistance value of each adjustable impedance 11. The adjustable impedance 11 may be a resistor ladder network having electronic switches, a voltage controlled resistance, or the like. The adjusting unit 12 interfaces each adjustable impedance 11 to provide a corresponding control signal. The subsea node 21 further includes a measuring unit 18. The measuring unit 18 interfaces the adjusting unit 12. The adjusting unit 12 determines the number of external nodes connected to the broadcast serial bus 30 by the measuring unit 18. Based on the determined number of nodes, the adjusting unit 12 automatically sets the resistance value of the adjustable impedance 11.

Each external node is supplied with power from the subsea canister 50 by the power bus 35. Using measuring unit 18, the power consumption of all connected nodes is measured by measuring the power consumption on the power bus 35. If all nodes connected to the power bus 35 are of the same type, the nodes have the same power consumption. Each node will then add the same current to the total current on the power bus 35. If each sensor uses a current I, than the total current on the power bus 35 will be m*I, with m being the total number of currently connected nodes (e.g., including node 21). Thus, the number of externally connected nodes n may be determined automatically, and the resistance value $R_{TSC}$ of the adjustable impedance 11 may be set accordingly.

The measuring unit 18 may be configured to measure the current on power bus 35. The adjusting unit 12 may be preconfigured with the information on which current a single node requires, and the adjusting unit 12 may determine the number of connected nodes from the total current. The adjusting unit 12 may set $R_{TSC}$ to an appropriate value as described above, for example, in reference to equation (2).

The full automatic adjustment of $R_{TSC}$ may be performed, and an automatic and dynamic termination of the broadcast serial bus 30 may be realized. The automatic and dynamic termination of the broadcast serial bus 30 may result in the desired total bus impedance irrespective of the number of connected external nodes in a range of n=1 to n=N−1.

Figure 6:
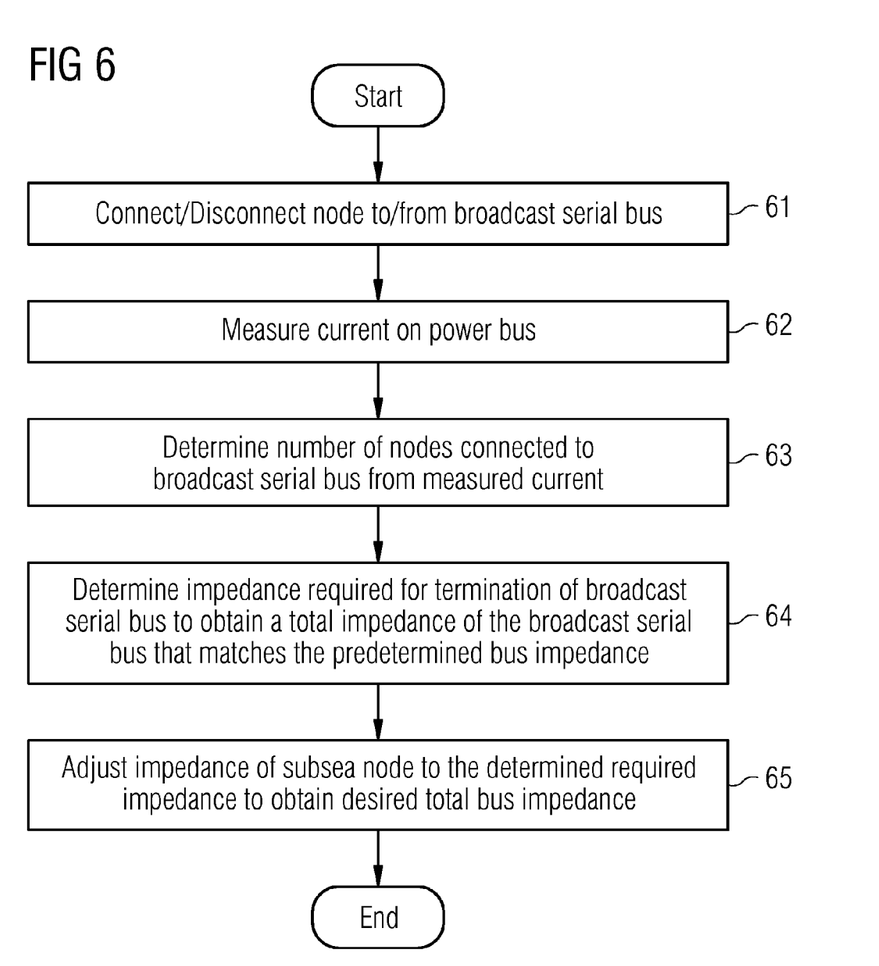
FIG. 6 is a schematic flow diagram illustrating an exemplary method of adjusting the termination impedance of a broadcast serial bus.

FIG. 6 shows a flow diagram of an exemplary method in accordance with the present teachings. The method may be performed by a broadcast serial bus termination circuit, a subsea node, and a subsea broadcast serial bus system in any of the configurations described above. In act 61, a node (e.g., a sensor node) is connected to or disconnected from the broadcast serial bus (e.g., a serial based multidropped bus). The current on the power bus 35 is measured in act 62. Based on the current measurement, the number of nodes connected to the broadcast serial bus may be determined in act 63. In act 64, the termination impedance from subsea node 21 is determined so that the total impedance of the broadcast serial bus matches the predetermined bus impedance. This determination may be based on the number of connected nodes and equation (2).

The adjustable impedance of the subsea node may be adjusted in act 65 to the determined required impedance in order to provide the desired total bus impedance. The adjustment may be achieved by providing a corresponding control signal to electronic switches of a resistor ladder or by providing a control voltage to a voltage controlled resistor.

Act 62 may be performed by the measuring unit 18. Acts 63 to 65 may be performed by the adjusting unit 12. The adjusting unit 12 may be implemented as a controller using a microprocessor, a digital signal processor, an ASIC, an FPGA or the like.

In accordance with the present teachings, a dynamic and adjustable termination of the broadcast serial bus may be achieved. The broadcast serial bus may be a controller area network (CAN) bus, a Profibus, or any other type of serial based multidrop bus. In some embodiments, the number of nodes (e.g., sensors) connected to an existing bus or network during a life cycle may be upgraded. The desired total impedance on the broadcast serial bus may be achieved irrespective of the number of connected nodes. The maximum number of connecting nodes N (e.g., for which the subsea node and the termination circuit may adjust the impedance of the broadcast serial bus) may be selected before installation. By setting N to a higher number, additional nodes may be connected to the bus at a later stage. Thus, a future expansion of the bus system (e.g., a sensor network) may be provided without servicing the master node/bus termination.

While the present invention has been described above by reference to various embodiments, it should be understood that many changes and modifications may be made to the described embodiments. It is therefore intended that the foregoing description be regarded as illustrative rather than limiting, and that it be understood that all equivalents and/or combinations of embodiments are intended to be included in this description.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding claim—whether independent or dependent—and that such new combinations are to be understood as forming a part of the present specification.

The invention claimed is:

1. A broadcast serial bus termination circuit for a broadcast serial bus, the broadcast serial bus having a variable number of nodes connected thereto, wherein each node of the variable number of nodes is connected in parallel to a first signal line and a second signal line of the broadcast serial bus, wherein each node of the variable number of nodes connects the first signal line to the second signal line via a node impedance, and wherein the broadcast serial bus is configured for operation with a predetermined bus impedance, the broadcast serial bus termination circuit comprising:
an adjustable impedance connected, in operation, between the first signal line and the second signal line of the broadcast serial bus; and
an adjusting unit configured for adjusting the adjustable impedance based on a number of the nodes connected to the broadcast serial bus, such that a total impedance of the broadcast serial bus corresponds to the predetermined bus impedance for different numbers of nodes.

2. The broadcast serial bus termination circuit of claim 1, wherein the adjustable impedance is configured for adjustment based on integer fractions of the node impedance.

3. The broadcast serial bus termination circuit of claim 1, wherein the adjustable impedance comprises a voltage controlled resistance.

4. The broadcast serial bus termination circuit of claim 1, wherein the adjustable impedance comprises a field effect transistor.

5. The broadcast serial bus termination circuit of claim 1, wherein the adjustable impedance comprises a resistor ladder.

6. The broadcast serial bus termination circuit of claim 1, wherein the adjusting unit comprises a controller configured for controlling a value of the adjustable impedance.

7. The broadcast serial bus termination circuit of claim 1, wherein the adjusting unit comprises a mechanical switch configured for selecting different values of the adjustable impedance.

8. The broadcast serial bus termination circuit of claim 1, wherein the broadcast serial bus termination circuit is configured for adjusting the total impedance of the broadcast serial bus to match the predetermined bus impedance up to a predetermined maximum number of nodes.

9. A subsea node for a broadcast serial bus, the broadcast serial bus having a variable number of nodes connected thereto, wherein each node of the variable number of nodes is connected in parallel to a first signal line and a second signal line of the broadcast serial bus, wherein each node of the variable number of nodes connects the first signal line to the second signal line via a node impedance, and wherein the broadcast serial bus is configured for operation with a predetermined bus impedance, the subsea node comprising:
a broadcast serial bus termination circuit that is, in operation, connected to the first signal line and the second signal line, wherein the broadcast serial bus termination circuit comprises:
an adjustable impedance connected, in operation, between the first signal line and the second signal line of the broadcast serial bus; and
an adjusting unit configured for adjusting the adjustable impedance based on a number of the nodes connected to the broadcast serial bus, such that a total impedance of the broadcast serial bus corresponds to the predetermined bus impedance for different numbers of nodes.

10. The subsea node of claim 9, wherein the subsea node is configured to automatically determine the number of nodes connected to the broadcast serial bus, and to adjust the adjustable impedance based on the determined number of connected nodes.

11. The subsea node of claim 9, wherein the subsea node and the nodes connected to the broadcast serial bus are powered from a common power bus, and wherein the subsea node is configured for measuring power consumption on the power bus in order to determine the number of nodes connected to the broadcast serial bus.

12. A subsea broadcast serial bus system comprising:
a broadcast serial bus having a first signal line and a second signal line;
one or more nodes connected in parallel to the first signal line and the second signal line of the broadcast serial bus, wherein each node of the one or more nodes connects the first signal line to the second signal line via a node impedance; and
a subsea node connected to the first signal line and the second signal line and terminating the broadcast serial bus;
wherein the subsea node comprises:
a broadcast serial bus termination circuit that is, in operation, connected to the first signal line and the second signal line; and
wherein the broadcast serial bus termination circuit comprises:
an adjustable impedance connected, in operation, between the first signal line and the second signal line of the broadcast serial bus; and
an adjusting unit configured for adjusting the adjustable impedance based on a number of the nodes connected to the broadcast serial bus, such that a total impedance of the broadcast serial bus corresponds to the predetermined bus impedance for different numbers of nodes.

13. The subsea broadcast serial bus system of claim 12, further comprising a subsea canister, wherein the subsea node comprises a master node located inside the subsea canister.

14. The subsea broadcast serial bus system of claim 12, wherein the nodes connected to the broadcast serial bus are located outside the subsea canister, and wherein the subsea broadcast serial bus system comprises one or more further subsea canisters housing one or more of the nodes.

15. The subsea broadcast serial bus system of claim 12, wherein the nodes connected to the broadcast serial bus are sensor nodes.

16. The subsea broadcast serial bus system of claim 12, further comprising a power bus, wherein the subsea node and the nodes connected to the broadcast serial bus are supplied with electric power by the power bus.

17. A method of terminating a broadcast serial bus, the method comprising:
determining a number of nodes connected to the broadcast serial bus;

adjusting an impedance of a node connected between a first signal line and a second signal line of the broadcast serial bus based on the determined number of connected nodes;

wherein the adjusting of the impedance is performed such that a total impedance on the broadcast serial bus corresponds to a predetermined bus impedance at which the broadcast serial bus is to be operated.

18. The broadcast serial bus termination circuit of claim 2, wherein the adjustable impedance comprises a voltage controlled resistance.

19. The broadcast serial bus termination circuit of claim 4, wherein the field effect transistor comprises a junction gate field effect transistor (JFET).

20. The broadcast serial bus termination circuit of claim 2, wherein the adjustable impedance comprises a resistor ladder.

* * * * *